United States Patent [19]

McLaughlin

[11] 4,386,463
[45] Jun. 7, 1983

[54] LEAD FRAME EMBEDDING FIXTURE

[75] Inventor: Richard S. McLaughlin, Dallas, Tex.

[73] Assignee: Mostek Corporation, Carrollton, Tex.

[21] Appl. No.: 308,492

[22] Filed: Oct. 5, 1981

[51] Int. Cl.³ .................. H01R 43/00; B23P 19/00
[52] U.S. Cl. ................................. 29/827; 29/740; 29/588; 33/180 R; 269/315; 339/17 CF
[58] Field of Search ............... 29/827, 760, 759, 588, 29/589, 740; 174/52 FP; 269/137, 303, 315; 339/17 CF; 33/180 R

[56] References Cited

U.S. PATENT DOCUMENTS

| | | |
|---|---|---|
| 3,524,249 | 8/1970 | Hamada et al. |
| 3,617,819 | 11/1971 | Boisvert |
| 3,781,457 | 12/1973 | McKerreghan |
| 3,831,131 | 8/1974 | Woodcock et al. |
| 3,832,480 | 8/1974 | Bunker |
| 4,224,637 | 9/1980 | Hargis |
| 4,232,815 | 11/1980 | Nakano et al. |

Primary Examiner—Francis S. Husar
Assistant Examiner—Carl J. Arbes

[57] ABSTRACT

An improved fixture (28) is provided for positioning components of an integrated circuit (10) during the manufacturing process. In particular, a boat (32) is provided for supporting the lead frame (18) and base (14) of an integrated circuit in a predetermined position for bonding and embedding of the lead frame to the base. A guide assembly (30) is employed with the boat (32) when positioning the lead frame and base. The lead frame is inverted and slid along a guide surface (46) into a notch (74) to abut a surface (76) of a stop pin (72). The opposite end of the lead frame abuts a second surface (80) on a stop bar (66). Diverging faces (68) on opposite sides of the guide surface center the lead frame relative to the boat and guide assembly. A base is then slid along the inside of the lead frame to abut against a second abutting surface (80) on the stop pin (72) to position the base and lead frame in a predetermined relationship. The guide assembly may then be removed and the boat with lead frame and base inserted into an oven for bonding. The lead frame and base are preferably supported at a slight angle to the horizontal between the stop bar and pin stop to ensure the predetermined relative position is maintained during bonding.

13 Claims, 13 Drawing Figures

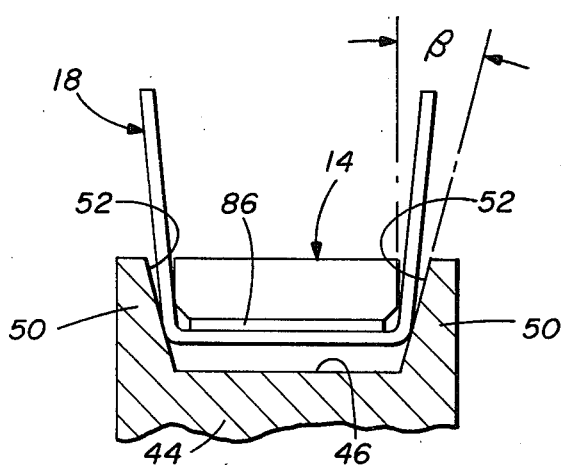
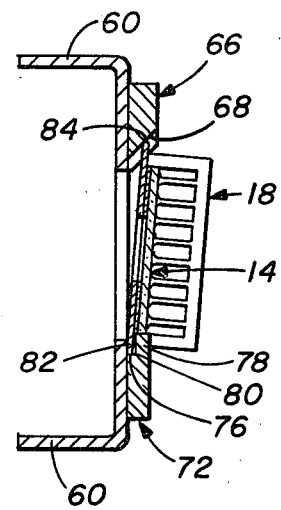
FIG. 5
FIG. 6
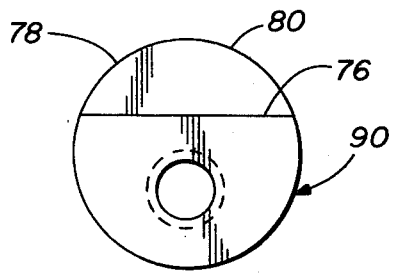
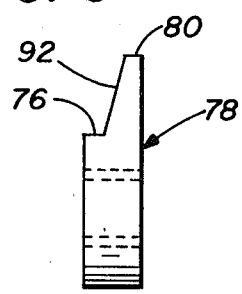
FIG. 7a
FIG. 7b
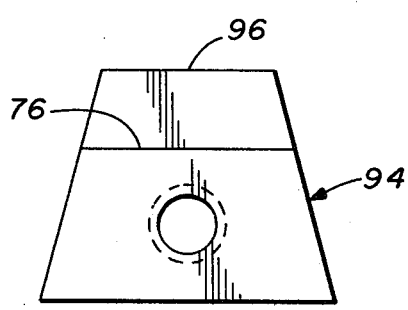
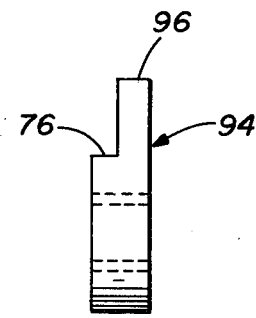
FIG. 8a
FIG. 8b

LEAD FRAME EMBEDDING FIXTURE

TECHNICAL FIELD

This invention relates to the manufacture of electronic components, and in particular to the manufacture of integrated circuits.

BACKGROUND ART

The manufacturing of integrated circuits or IC's has become a huge industry in recent years. The industry is expected to grow in the same manner in the foreseeable future. At the heart of the industry is the capacity to integrate a highly complex integrated circuit chip in an integrated circuit assembly for placement on a circuit board for interaction with other circuits in an electronic device.

The IC assembly will typically include the IC chip and some type of mounting structure to support the chip. A lead frame is typically secured to the mounting structure. The individual electrical conductors in the lead frame extend from the chip to form pins for electrical contact with other components in a circuit as well as for mounting the IC. The individual conductors in the lead frame are connected to predetermined areas on the chip with lead wires typically soldered therebetween.

A number of integrated circuit designs include a ceramic base for mounting the lead frame and chip. The base includes a thin layer of glass. The base with a lead frame positioned thereon is heated to render the glass layer liquidous. The weight of the lead frame on the base causes it to become embedded in the glass layer. Upon cooling, the lead frame is hermetically sealed within the glass layer on the base.

The integrated circuit chip may then be positioned on the base and electronically interconnected to the lead frame. A ceramic cover may then be applied over the lead frame and chip. The cover also includes a glass layer which may be heated to sandwich the lead frame and chip between the base and cover.

This particular integrated circuit design has significant value in military applications. The sandwiched design protects the sensitive components of the IC from shock and moisture and thereby increases reliability. The design has also been found to be very advantageous for use in relatively high temperature environments.

An important factor in the manufacture of integrated circuits is the ability and capacity to manufacture a large number of integrated circuits to reduce the per capita cost to a competitive level. It is not unusual for the particular integrated circuit design discussed above to have a production run of 800,000 to a 1,000,000 IC's produced each week by a single company. Therefore, any apparatus or method for reducing the manufacturing costs is important to the industry.

In the past, manual labor has been used to mount the base and lead frame in a metal frame structure referred to as a "boat" in the industry. The usual boat is designed to position a large number of bases and lead frames in a predetermined position for entry into an oven to embed the lead frame in the glass layer of the base. The boats include vertical walls to act as guides to position the base and lead frame. One such boat is manufactured and sold by Damco labs of Redwood City, Calif.

To achieve the necessary manufacturing tolerances of between 10 and 15 thousandths of an inch, manual labor has been used extensively to individually position and align the bases and lead frames within the boats.

The close tolerances required have made automation of the process impractical. In addition, the open framework nature of the prior known boats have often permitted either bases or lead frames to fall through the structure defining the positioning walls. These factors have reduced efficiency in manufacture.

Therefore, a need has been shown to increase the ease of IC manufacture by swiftly and accurately positioning a base and lead frame for entry into an oven to embed the lead frame. In addition, a need has arisen to automate the positioning of a lead frame and base for embedding, thereby reducing costs and increasing output.

DISCLOSURE OF THE INVENTION

In accordance with one aspect of the present invention, an apparatus for use in assembling an integrated circuit including first and second components is provided. The apparatus includes a frame structure and at least one stop pin secured on the frame structure. A stop bar having an inclined face is secured to the frame structure spaced from the stop pin for positioning the first component between the pin and the inclined face. The spacing is such as to provide an inclination to the first component to urge the component into a predetermined position relative to the frame structure. The second component is positioned on the first component for slidable motion with respect thereto to abut the stop pin. The second component is thereby positioned in a predetermined relationship to the first component and frame structure.

In accordance with another aspect of the present invention, the apparatus includes a guide structure. The guide structure is positioned between the stop pin and stop bar with the guide structure having inclined walls for contacting the first component to center the first component with respect to the stop pin and stop bar.

In accordance with another aspect of the present invention, the guide structure includes a guide surface for sliding the first component into the predetermined position. In accordance with another aspect, the guide structure is removable. The guide structure has leg structure for supporting the frame structure and guide structure in an orientation to slide the first and second components into the predetermined position. The frame structure is supported upon removal of the guide structure in an orientation to maintain the first and second components in the predetermined positions.

In accordance with yet another aspect of the present invention, a method is provided for assembling an integrated circuit including a lead frame and a base. The method includes the steps of sliding the lead frame downwardly along a surface of a fixture including a boat to abut against a stop pin for positioning the lead frame in a predetermined relationship to the boat. The method further includes the step of sliding the base downwardly along the lead frame to abut the stop pin for positioning the base in a predetermined relationship to the boat and lead frame.

In accordance with yet another aspect of the present invention, the method further includes the step of tilting the boat to increase the angle of the surface on the boat relative to the horizontal during positioning of the lead frame and base. The method further includes the step of subsequently tilting the boat to decrease the angle of the surface relative to the horizontal to position the surface at an angle sufficient to retain the lead frame and base in the predetermined relationship for bonding.

BRIEF DESCRIPTION OF DRAWINGS

A more complete understanding of the invention may be had by reference to the following Detailed Description taken in conjunction with the accompanying Drawings, wherein:

FIG. 5 illustrates a vertical cross-sectional view of the guide assembly, lead frame and base;

FIG. 6 illustrates a vertical cross-section of the boat tilted to retain the lead frame and base in the predetermined position;

FIG. 7a illustrates a plan view of a first modification of the stop pin employed in the boat;

FIG. 7b illustrates a side view of the first modification of the stop pin;

FIG. 8a illustrates a plan view of a second modification of the stop pin of the boat; and FIG. 8b illustrates a side view of the second modification of the stop pin.

DETAILED DESCRIPTION

Figure 1A:
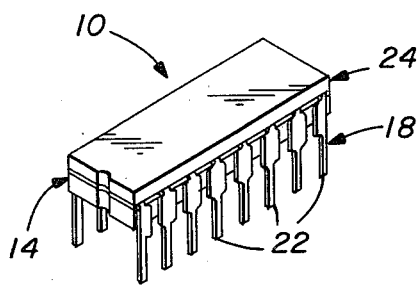
FIG. 1a is a perspective view of an integrated circuit.
Figure 1B:
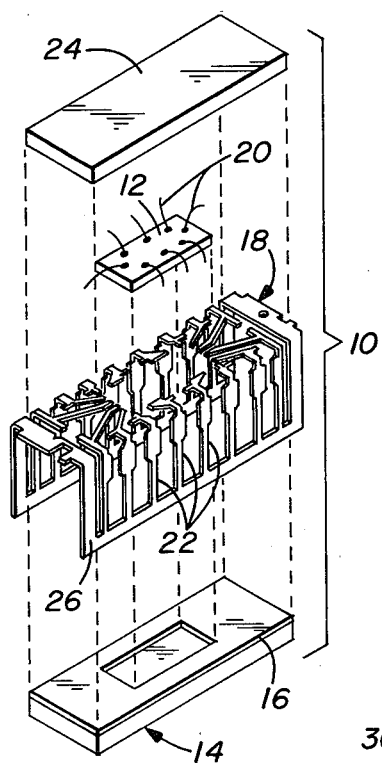
FIG. 1b is an exploded view of the integrated circuit illustrating the major components of the circuit.

Referring now to the Drawings, wherein like reference characters designate like or corresponding parts throughout several views, FIGS. 1a and 1b illustrate an integrated circuit 10 and its major components. The integrated circuit or IC 10 includes the integrated circuit chip 12 containing the microcircuitry. The chip 12 is mounted on a ceramic base 14 having a glass layer 16. A lead frame 18 is embedded in the glass layer 16 on the base 14. Individual lead wires 20 interconnect each individual conductor 22 on the lead frame with an area of the chip 12. Finally, a ceramic cover 24 is positioned over the base, lead frame and chip which also includes a glass layer. The cover and base sandwich the components of the IC between each other to protect the device as best seen in FIG. 1a. In use, the retaining bar 26 is removed from the exposed ends of each of the conductors 22 to mount the IC on a circuit board.

Figure 2:
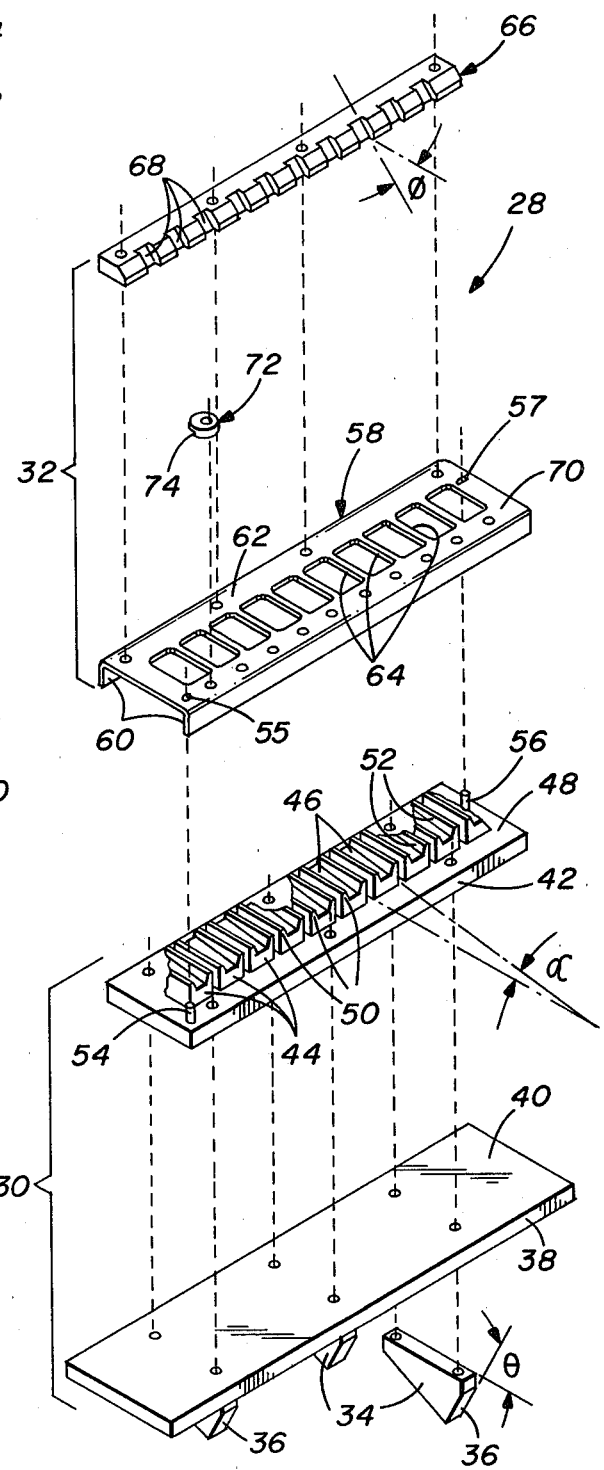
FIG. 2 is an exploded view of a fixture forming one embodiment of the present invention.

FIG. 2 illustrates an exploded view of a fixture 28 forming a first embodiment of the present invention. The fixture 28 may be employed to assemble components of an IC 10 with the use of either manual or automated procedures. The fixture includes two major substructures, a guide assembly 30 and a boat 32. The guide assembly and boat are employed in combination to load the boat 32 with bases 14 and lead frames 18 and to position these components in a predetermined relation. The boat 32 is then separated from the guide assembly and may be used to pass the positioned bases and lead frames through an oven to turn the glass layer 16 liquidous and embed the lead frame 18 within the glass layer 16. The oven may, for example, be heated by infrared radiation.

The guide assembly 30 includes a number of legs 34 having a ground contact surface 36. The legs are secured to a plate 38. The surface 36 of the legs 34 extends at an angle $\theta$ so that the plane including the top surface 40 of plate 38 extends at the angle $\theta$ relative to the surface on which the guide assembly rests. In one design constructed under the teachings of the present invention, the angle $\theta$ was 60°. The legs 34 and plate 38 were constructed of aluminum.

Figure 4:
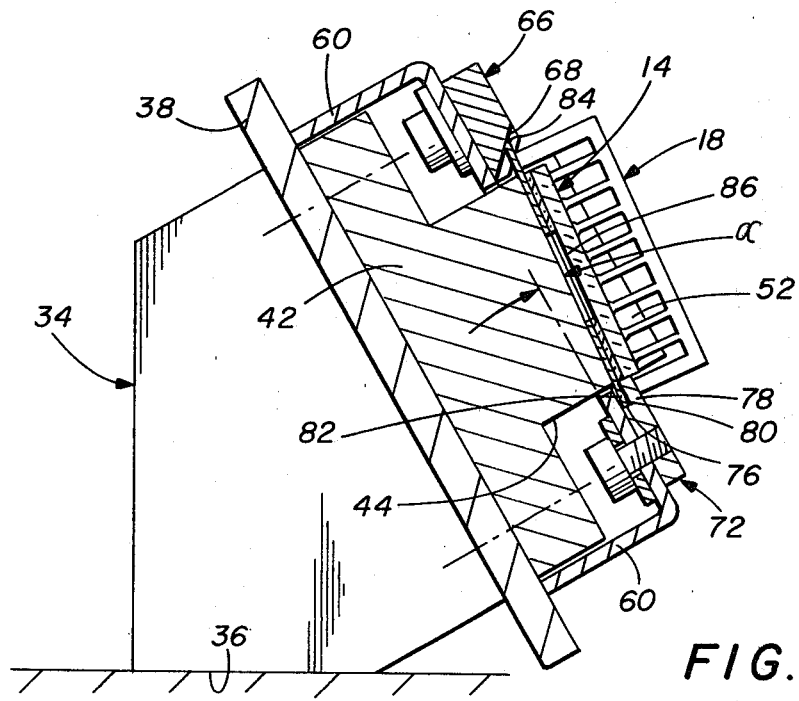
FIG. 4 illustrates a vertical cross-section of the fixture tilted for sliding components of the integrated circuit into a predetermined position.

A guide plate 42 is secured abutting the top surface 40 as shown. The guide plate has a number of extensions 44 which extend from the upper surface of the guide plate, opposite the top surface 40. Each extension 44 includes a relatively flat guide surface 46 oriented at an angle $\alpha$ to the top surface 40 of plate 38 and top surface 48 of guide plate 42, as best shown in FIGS. 2 and 4. Extension walls 50 extend upwardly from the guide surfaces 46 on either side thereof and include inclined faces 52. The inclined faces 52 are inclined outwardly from the guide surfaces 46 at an angle $\beta$ as best seen in FIG. 5. Guide pins 54 and 56 also extend upwardly from the top surface 48. The pins preferably extend in an unsymmetrical manner from the top surface. In the design constructed according to the teachings of the invention, the guide plate 42 was constructed from an acetal resin high molecular weight polymer such as marketed under the trade name Delrin by the E. I. DuPont de Nemours & Company, Inc. of the United States.

The boat 32 includes a support plate 58 having a generally U-shaped cross section. The plate includes downwardly extending legs 60 and a planar section 62 having a number of rectangular apertures 64 formed therethrough. A hole 55 and slot 57 are provided to receive pins 54 and 56, respectively. The tolerances of the pin, hole and slot dimensions insure precise positioning of the guide plate relative to support plate 58. A stop bar 66 is secured along one edge of the support plate in the elongate direction. The stop bar includes inclined faces 68 positioned therealong adjacent each aperture 64 and inclined at an angle $\phi$ to the top surface 70 of the planar section 62. In the design made in accordance with the present invention, the angle $\phi$ is 45°.

A series of pin stops 72 are secured on the planar section 62 of the support plate on the opposite elongate edge of the plate. A pin stop is secured adjacent each of the apertures 64 opposite the inclined faces 68.

Each of the pin stops illustrated in FIGS. 2-6 have a cylindrical shape. As best seen in FIG. 4, a notch 74 is formed in each stop to form a first abutting surface 76. The lip 78 formed by the notch defines a second abutting surface 80. In the design, the support plate 58, stop bar 66 and stop pin 72 are formed of stainless steel.

The fixture 28 is adapted for positioning a lead frame 18 and base 14 in a predetermined relationship on boat 32 embedding the lead frame in the glass layer of the base. This operation may be either mechanically or automatically performed. To position the lead frame and base in the boat, the guide assembly 30 is positioned on a flat, horizontal surface and the boat 32 is placed atop the guide assembly as best seen in FIG. 4. The bottom surfaces of the legs 60 of the support plate 58 rests on the top surface 40. Each extension 50 extends through one of the apertures 64 to substantially fill the aperture.

Figure 3A:
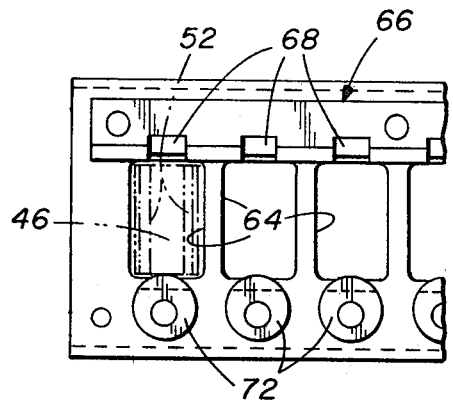
FIGS. 3a, 3b, and 3c illustrate top views of the fixture empty, supporting lead frames and supporting lead frames and bases, respectively.
Figure 3B:
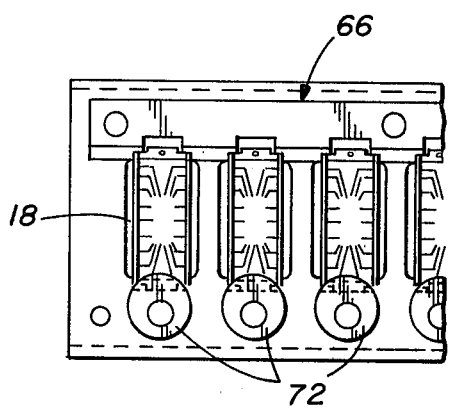
Figure 3C:
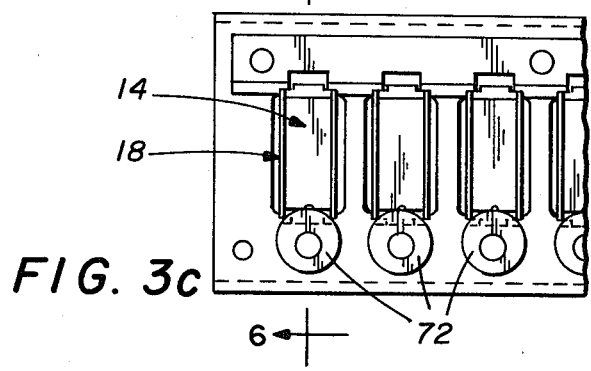

The lead frames 18 are inserted in an inverted manner as best illustrated in FIGS. 3b, 4 and 6. The lead frames may be placed or dropped into contact with the guide surface 46 of an extension 50. The severe downward angle of the guide surface provided by the angle $\theta$ on the legs 34 in combination with the angle $\alpha$ of guide surface 46 cause the lead frame to slide by gravity with one end 82 moving into abutting contact with the first abutting surface 76 of the associated stop pin 72. The inclined faces 68 and first abutting surface 76 are separated a predetermined distance so that the other end 84 of the lead frame will slide down the inclined face 68 when the first end 82 contacts surface 76. The faces 52 are positioned so that as the lead frame slides into abutment with surface 76, the lead frame also slides down the faces 52 to center the lead frame with respect to the stop bar and stop pin. The lead frame is thereby positioned in a predetermined relationship to the boat by gravity and without the necessity of precise placement of the lead frame within the boat. This simplifies the manual placement of a lead frame in a boat and also permits an automated sequence to be developed to perform the placement function.

A base 14 is then placed in a predetermined position relative to each lead frame on the boat. Again, the base is placed in the boat in an inverted condition, with glass layer 16 facing generally downward. The base may be dropped or placed to slide along the inner surface 86 of the lead frame 18 and into abutment with the second abutting surface 80. The U-shaped cross-section of the lead frames 18 centers each base relative to the lead frame as best seen in FIG. 5. Again, the base placement may be mechanically or automatically made.

The fixture 28 has thus performed the function of positioning each lead frame and base in a predetermined relationship. The boat 32 may then be removed from the guide assembly 30 for entry into an oven to bond or embed the lead frame to the base. When the boat 32 is supported on a horizontal surface, the lead frame and base rest at the angle $\alpha$ relative to the horizontal as best seen in FIG. 6. The angle $\alpha$ is sufficient to retain the lead frame and base in the predetermined relationship during the heating operation. In the design of the present invention, the angle $\alpha$ is between 7° and 10°.

FIGS. 7a and 7b illustrate a stop pin 90 forming a first modification of stop pin 72. The stop pin 90 includes the first abutting surface 76. However, the lip 78 is formed with a beveled surface 92 to reduce the width of the second abutting surface 80. The beveled surface 92 has been found advantageous to resist any tendancy for the liquidous glass 16 to adhere to the stop pin when embedding the lead frame.

A second modification of stop pin 72 is illustrated in FIGS. 8a and 8b as stop pin 94. The stop pin 94 includes a generally trapezoidal shape with a planar second abutting surface 96 for further insuring proper alignment and positioning of the base relative to the lead frame.

It is apparent that the fixture 28 designed according to the principles of the present invention is capable of accurately positioning bases and lead frames for embedding in precise relationship. The components of the IC may be positioned within the boat with either mechanical or automated procedures because the structural characteristics of the fixture actually perform the positioning function. The maintenance of the lead frame and base tilted at the relatively low angle $\alpha$ insures that the glass in the liquidous state will retain a uniform thickness across the base for embedding the lead frame. The extensions 44 prevent any lead frame or base from falling through one of the apertures 64 and causing a time delay in loading. It will be clear from the above that the fixture 28 may be adapted for placing the embedded lead frame and base with chip in a predetermined relationship to the cover for sandwiching the lead frame and chip within the cover and base.

Although a single embodiment of the invention has been illustrated in the accompanying Drawings and described in the foregoing Detailed Description, it will be understood that the invention is not limited to the embodiment disclosed, but is capable of numerous rearrangements, modifications and substitutions of parts and elements without departing from the spirit of the invention.

What is claimed:

1. An apparatus for use in assembling an integrated circuit including first and second components comprising:
   a frame structure;
   at least one stop pin secured on said frame structure, said stop pin having first and second abutting surfaces;
   a stop bar secured to said frame structure having an inclined face spaced from each stop pin for positioning a first component between each of said stop pins and the inclined face spaced therefrom, the spacing between the inclined faces on said stop bar and stop pins providing inclination to the first components to urge the first components into a predetermined position relative to said frame structure abutting the first abutting surfaces; and
   the second components being positioned on the first components for slidable motion with respect thereto to abut the second abutting surface of said stop pin, the second components being thereby positioned in a predetermined relationship to the first components and frame structure.

2. The apparatus of claim 1 wherein said apparatus further includes guide means positioned between said stop pins and inclined faces on said stop bar including a guide surface for sliding the first components into the predetermined position.

3. The apparatus of claim 2 wherein said guide means has inclined walls for contacting the first components to center the first components with respect to said stop pins and the inclined faces on said stop bar.

4. The apparatus of claim 2 wherein said guide means is removable, said guide means having leg means for supporting said frame structure in an orientation to slide the first and second components into the predetermined positions, said frame structure being supported in an orientation to maintain the first and second components in the predetermined positions subsequent to removal of said guide means.

5. The apparatus of claim 1 wherein the first component is a lead frame and the second component a base, said frame structure being adapted to slide the lead frame on said frame structure in an inverted position, the base being slid on the lead frame and centered with respect thereto by the inclined legs of the lead frame.

6. An apparatus for use in assembling an integrated circuit including a lead frame and base comprising:
   a support plate defining a planar top surface having a plurality of apertures therethrough and having legs extending therefrom;
   a stop bar secured along one edge of said support plate, said stop bar having faces adjacent each of said plurality of apertures inclined to the top surface;
   a stop pin secured along the edge of said support plate opposite said stop bar and adjacent each of said plurality of apertures, each of said stop pins having first and second abutting surfaces thereon;

a guide assembly having extensions thereon, said support plate being positionable on said guide assembly with an extension extending through each of said plurality of apertures, said extensions each defining a guide surface thereon inclined to the planar top surface of said support plate, said guide assembly further including leg means for supporting said guide assembly and support plate so that the planar top surface of said support plate is inclined to the horizontal, a lead frame being slidable along the guide surface of a selected one of said extensions extending through an aperture for abutting the first abutting surface of the adjacent stop bar and inclined face adjacent thereto to position the lead frame in a predetermined relationship to said support plate, a base being slidable along the lead frame to abut the second abutting surface of the adjacent stop pin to position the base in a predetermined relationship to the lead frame.

7. The apparatus of claim 6 wherein said support plate is removed from said guide assembly, the inclined face and first abutting surface supporting each lead frame being separated by a predetermined distance to maintain the lead frame and base at an angle relative to the top surface of said support plate to maintain the lead frame and base in the predetermined position.

8. The apparatus of claim 6 wherein each of said extensions includes opposed inclined faces diverging from the top surface of said support plate when extending therethrough to center the lead frame on said support plate, the lead frame having a U-shaped cross section for centering the base slid thereon.

9. An apparatus for use in assembling an integrated circuit including a lead frame and base comprising:
a support plate defining a planar top surface having a plurality of apertures therethrough and having legs extending therefrom for supporting said support plate;
a stop bar secured along one edge of said support plate, said stop bar having faces adjacent each of said plurality of apertures, said faces being inclined to the top surface;
a stop pin secured along the edge of said support plate opposite said support bar adjacent each of said plurality of apertures, each of said stop pins including a notch opening toward the adjacent aperture for receiving the end of a lead frame and defining a first abutting surface, the lip of said stop pin formed by the notch defining a second abutting surface;
a guide assembly having extensions thereon, the support plate being positionable on said guide assembly with an extension extending through each of said plurality of apertures, said extensions each defining a guide surface thereon inclined to the top surface of said support plate when said support plate is positioned on said guide assembly, said guide assembly further including legs for contacting a horizontal surface to incline the top surface of said support plate at an angle approximately 60° to the horizontal surface when said support plate is positioned on said guide assembly, a lead frame being positioned on the guide surface of an extension sliding along the guide surface and into the notch of the stop pin adjacent thereto to abut against the first abutting surface, said extensions further having inclined faces extending outwardly on opposite sides of said guide surface for centering the lead frame, a base being slidable along the lead frame to abut against the second abutting surface and being centered with respect to the lead frame by the diverging angles of the legs of the lead frame to position the base in a predetermined relationship with the lead frame, the guide assembly being removable from the support plate with the separation between the face of the stop bar and first abutting surface of a stop pin adjacent a given aperture being sufficient to maintain the lead frame and base at an angle relative to the horizontal to maintain the predetermined positions of the lead frame and base when the legs of said support plate support said support plate on a horizontal surface.

10. A method for assembling an integrating circuit including a lead frame and base to be bonded together comprising the steps of:
sliding the lead frame downwardly along a guide surface to abut a first abutting surface on a stop pin mounted on a frame structure, the lead frame being supported between the stop pin and an inclined face on a stop bar mounted on the frame structure for positioning the lead frame in a predetermined relationship to the frame structure;
sliding the base downwardly along the lead frame to abut a second abutting stop on the stop pin for positioning the base in a predetermined relationship to the lead frame and frame structure.

11. The method of claim 10 further comprising the step of tilting the frame structure and increasing the angle of the guide surface relative to the horizontal during positioning of the lead frame and base and subsequently tilting the frame structure to decrease the angle of the lead frame and base relative to the horizontal to an angle sufficient to retain the lead frame and base in the predetermined relationship for bonding.

12. A method for assembling an integrated circuit including a lead frame and base comprising the steps of:
positioning a lead frame in an inverted position on a guide surface of a guide assembly, the lead frame sliding down the guide surface until one end thereof engages a first abutting surface defined in a notch formed in a stop pin on a support structure, the opposite end of the lead frame abutting an inclined face on a stop bar on said support structure, outwardly diverging faces extending from said guide assembly on opposite sides of said guide surface centering the lead frame as it slides;
positioning a base on the lead frame, the base sliding down the lead frame so that one end thereof engages a second abutting surface defined on the stop pin, the lead frame and base thereby being positioned in a predetermined relative position for bonding.

13. The method of claim 12 further comprising the steps of mounting the support structure on the guide assembly, the guide assembly being positioned at an angle relative to the horizontal of approximately 60°, and removing the support structure from the guide assembly upon positioning the lead frame and base in the predetermined positions, the inclined faces and stop pin on the support structure maintaining the lead frames and bases inclined at an angle to the horizontal sufficient to retain the predetermined relationship when the support structure is supported on a horizontal surface.

* * * * *